United States Patent
Ma et al.

(10) Patent No.: US 9,984,926 B2
(45) Date of Patent: May 29, 2018

(54) SOLUTION FOR TSV SUBSTRATE LEAKAGE

(71) Applicant: SEMICONDUCTOR MANUFACTURING INTERNATIONAL (SHANGHAI) CORPORATION, Shanghai (CN)

(72) Inventors: Xiaotian Ma, Shanghai (CN); Yan Gao, Shanghai (CN); Liang Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days. days.

(21) Appl. No.: 14/873,182

(22) Filed: Oct. 1, 2015

(65) Prior Publication Data

US 2016/0111351 A1    Apr. 21, 2016

(30) Foreign Application Priority Data

Oct. 16, 2014    (CN) .......................... 2014 1 0548605

(51) Int. Cl.
H01L 21/768    (2006.01)

(52) U.S. Cl.
CPC .... H01L 21/76898 (2013.01); *H01L 21/7684* (2013.01); *H01L 21/76883* (2013.01); *H01L 2924/0002* (2013.01)

(58) Field of Classification Search
CPC ............. H01L 23/481; H01L 23/53238; H01L 21/76831; H01L 21/7684; H01L 21/76879; H01L 21/76898; H01L 21/76843; H01L 21/76864
See application file for complete search history.

(56) References Cited

U.S. PATENT DOCUMENTS

| 2014/0004698 A1* | 1/2014 | Huang | H01L 21/3212 |
| | | | 438/653 |
| 2015/0228555 A1* | 8/2015 | Rabie | H01L 23/481 |
| | | | 257/774 |

* cited by examiner

*Primary Examiner* — Jay C Chang
*Assistant Examiner* — Charles R Peters
(74) *Attorney, Agent, or Firm* — Kilpatrick Townsend & Stockton LLP (57) ABSTRACT

A semiconductor device manufacturing method includes providing a wafer, which includes a semiconductor substrate, a semiconductor device located on the semiconductor substrate, an interlayer dielectric layer covering the semiconductor device, and a through hole penetrating through the interlayer dielectric layer and a portion of the semiconductor substrate. A metal layer is formed inside the through hole and on a surface of the interlayer dielectric layer. A first planarization process is conducted to remove a portion of the metal layer on the surface of the interlayer dielectric layer. The method also includes conducting an annealing alloy treatment and conducting a second planarization process to completely remove the metal layer on the surface of the interlayer dielectric layer. The manufacturing methods can slowly release stress of the wafer and effectively prevent cracks in silicon vias, thereby reducing TSV leakage problems, thus improving the reliability and yield of the devices.

9 Claims, 5 Drawing Sheets

SOLUTION FOR TSV SUBSTRATE LEAKAGE

CROSS-REFERENCES TO RELATED APPLICATIONS

This application claims priority to Chinese patent application No. 201410548605.4, filed on Oct. 16, 2014, the content of which is incorporated herein by reference in its entirety.

BACKGROUND OF THE INVENTION

The present invention relates to semiconductor technologies, and more particularly to manufacturing techniques of a type of semiconductor devices.

Through silicon via (TSV) technology is one of the key technologies for three dimensional (3D) packaging. TSV is the latest technology for chip-to-chip interconnects by manufacturing vertical conductions between chips or between wafers. Differing from conventional IC stacking technologies using package bonds or bumps, TSV can achieve maximum 3D packing density and minimum physical dimension, and greatly improve the performance of the chips in speed and power consumption.

Based on the stage of the manufacturing process at which a TSV process is performed, TSV manufacturing processes can be categorized as via-first, via-middle and via-last, wherein via-first is the process of etching TSV on a blank silicon wafer before manufacturing CMOS; via-middle is the process of etching TSV after manufacturing CMOS but before the back end of line (BEOL) process; and via-last is the process of etching TSV on the back side of a thinned wafer after the BEOL process.

Typically, a via-middle process includes TSV etching, copper (Cu) plating and filling, mechanical polishing, deposition of metal wiring layer Ml, and BEOL, after contact via (CT) etching, filling and mechanical polishing. This method introduces TSV process before depositing metal wire layer Ml, can achieve a better integration with various processes in the Fab, and is the most commonly used method in the industry.

Figure 1:
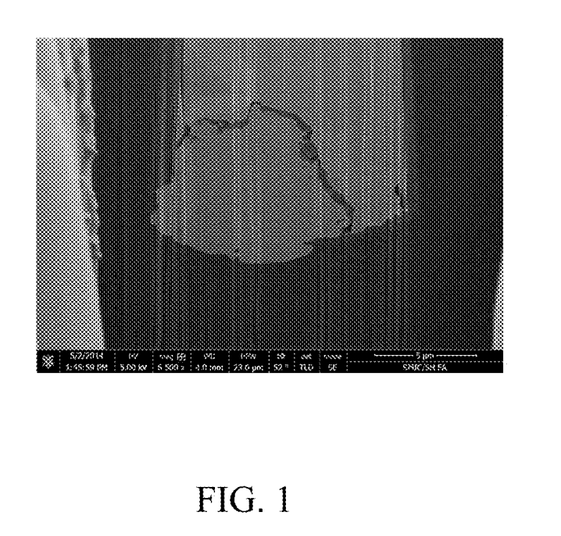
FIG. 1 is a schematic diagram illustrating cracks generated between a TSV and a substrate.

Current via-middle processes commonly use metals with high conductivity, such as Cu, as TSV filling material. However, the thermal expansion coefficient of copper is 7.4 times of that of silicon, resulting in a large stress mismatch, especially after copper metal filling, and before and after the chemical mechanical polishing process on the copper layer, during which the stress may change dramatically, causing cracks between the TSV and the substrate as shown in FIG. 1. The presence of cracks allows the copper metal to diffuse into the substrate, resulting in greatly increased leakage and hence serious reliability problems. Therefore, the inventors have determined that how to slowly release stress, prevent cracks in silicon vias and thus, reduce wafer acceptance test (WAT) leakage is a problem to be solved at present time.

BRIEF SUMMARY OF THE INVENTION

The Brief Summary of the Invention section introduces a series of concepts in a simplified form, which will be described in further detail in the Detailed Description section. The Brief Summary of the Invention section of the present disclosure is not meant to attempt to define key features and necessary technical features of the claimed technical solution, much less attempting to determine the scope of the claimed technical solution.

The present invention provides a semiconductor device manufacturing method to overcome current problems. The method includes providing a wafer which includes a semiconductor substrate, a semiconductor device located on the semiconductor substrate, an interlayer dielectric layer formed on the semiconductor substrate for covering the semiconductor device, and a through hole penetrating through the interlayer dielectric layer and a portion of the semiconductor substrate. A metal layer is formed inside the through hole and on a surface of the interlayer dielectric layer. The method also includes conducting a first planarization process to remove a portion of the metal layer on the surface of the interlayer dielectric layer, and conducting an annealing alloy treatment. The method further includes conducting a second planarization process to completely remove the metal layer on the surface of the interlayer dielectric layer.

In some embodiments, a thickness of the portion of the metal layer removed during the first planarization process is 70% to 90% of the thickness of the metal layer on the surface of the interlayer dielectric layer.

In some embodiments, a temperature of the annealing alloy treatment is between 100° C. and 450° C., and a time of the annealing alloy treatment is between 1 and 60 minutes.

In some embodiments, a material of the metal layer is copper.

In some embodiments, the metal layer is formed by chemical plating.

In some embodiments, the method further includes, before forming the metal layer, forming a hard mask layer on the interlayer dielectric layer, the through hole penetrating through the hard mask layer, the interlayer dielectric layer and the portion of the semiconductor substrate.

In some embodiments, the method further includes, before forming the metal layer, sequentially depositing an isolation layer and a barrier layer on a bottom and side walls of the through hole and the surface of the interlayer dielectric layer.

In some embodiments, the second planarization process further removes the isolation layer and the barrier layer on the surface of the interlayer dielectric layer.

In some embodiments, the first and the second planarization processes are chemical mechanical polishing processes.

In some embodiments, a material of the isolation layer is at least one of silicon oxide, silicon nitride, oxide-nitride-oxide multilayer structure, hafnium oxide or aluminum oxide; and a material of the barrier layer is at least one of titanium-titanium nitride, tantalum-tantalum nitride, zirconium nitride, tungsten, tungsten nitride or titanium zirconium nitride.

In summary, manufacturing methods according to the present invention can slowly release stress of the wafer and effectively prevent cracks in silicon vias, thereby reducing TSV leakage and improving the reliability and yield of semiconductor devices.

BRIEF DESCRIPTION OF THE DRAWINGS

The following drawings, as a part of the present disclosure, will provide a better understanding of the present invention. The drawings illustrate embodiments of the present invention, and together with the accompanying description, serve to explain the principles of the present invention. Among the drawings.

DETAILED DESCRIPTION OF THE INVENTION

In the following description, numerous specific details are provided for a thorough understanding of the present invention. However, it should be apparent to those of skill in the art that the present invention may be realized without one or more of these details. In other examples, technical features known in the art will not be described in order not to obscure the present invention.

It should be understood that the present invention may be realized in different forms, and should not be construed as limited to the embodiments provided in the present disclosure. Rather, these embodiments are provided to make the present disclosure more thorough and complete, and to fully convey to those of skill in the art the scope of the present invention. In the accompanying drawings, the dimensions and relative dimensions of various layers and regions may be exaggerated for clarity, Same reference numbers are used to represent same elements throughout the drawings.

It should be understood that, when an element or layer is referred to as "on," "adjacent to," "connected to" or "coupled to" another element or layer, it can be disposed directly on the other element or layer, adjacent to, connected or coupled to the other element or layer, or intervening elements or layers which may also be present. In contrast, when an element is referred to as being "directly on," "directly adjacent to," "directly connected to" or "directly coupled to" another element or layer, there are no intervening elements or layers present between them. It should be understood that, although the terms "first," "second," "third," etc, may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the teachings of the present invention.

Spatial relationship terms, such as "under," "below," "bottom," "underneath," "over," "on," "above" and "top," are used herein for convenience, to describe a relationship of one element or feature with another element or feature as illustrated in the figures. It should be understood that, in addition to the orientation depicted in the figures, these spatial relationship terms are intended to encompass different orientations of devices in use and during operation. For example, if a device shown in the figures is flipped, an element being described as "below" or "underneath" another element would then be oriented as "above" the other element. Therefore, the exemplary term "below," "under" or "underneath" can encompass both orientations of above and below. Because devices or components of embodiments of the present invention can be positioned in a number of different orientations (e.g., rotated 90 degrees or at other orientations), the spatial relationship terms used herein should be interpreted accordingly.

The terms used herein are for the purpose of describing the embodiments and are not intended to limit the present invention. As used herein, the singular terms "a," "an" and "the" may include singular and plural references, unless clearly indicated otherwise in the context. It should be further understood that the terms "comprising," "including," "having" and variants thereof, when used in this specification, specify the presence of stated features, numbers, steps, operations, elements and/or components, but do not preclude the presence or addition of one or more other features, numbers, steps, operations, elements, components and/or groups thereof. Furthermore, as used herein, the words "and/or" may refer to and encompass any and all possible combinations of one or more of the corresponding listed items.

In the following description, numerous detailed processes are provided to describe the technical solution provided in the present invention, for a thorough understanding of the present invention. Preferred embodiments of the present invention are described below in detail, however, the present invention may be realized in numerous other embodiments, in addition to the embodiments described in detail herein.

Problems associated with an existing TSV processing flow are further described below with reference to FIGS. 2A-2B.

Figure 2A:
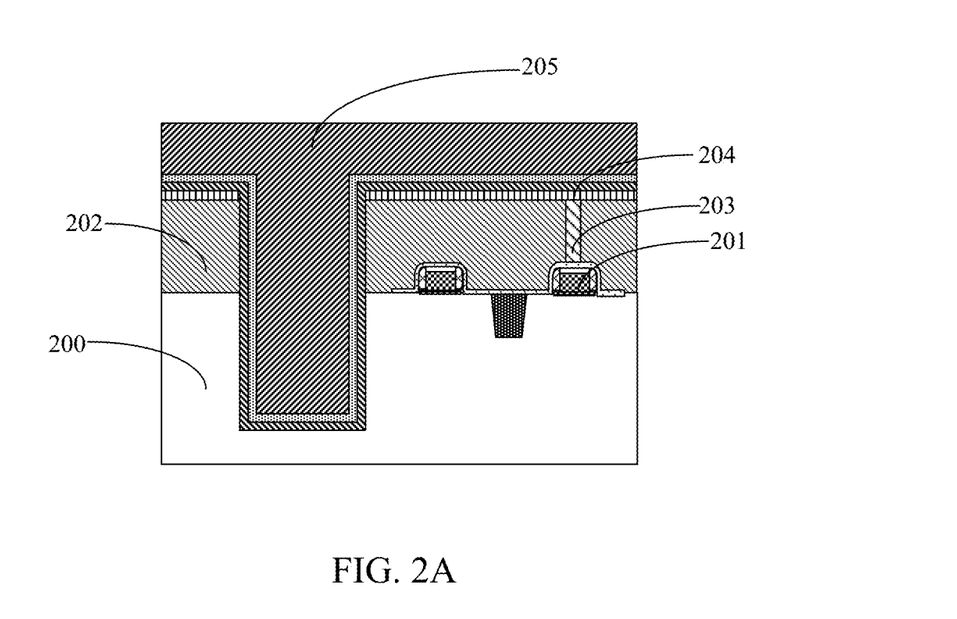
FIGS. 2A-2B illustrate cross-sectional views of a device manufactured by corresponding processes of a current TSV process.
Figure 2B:
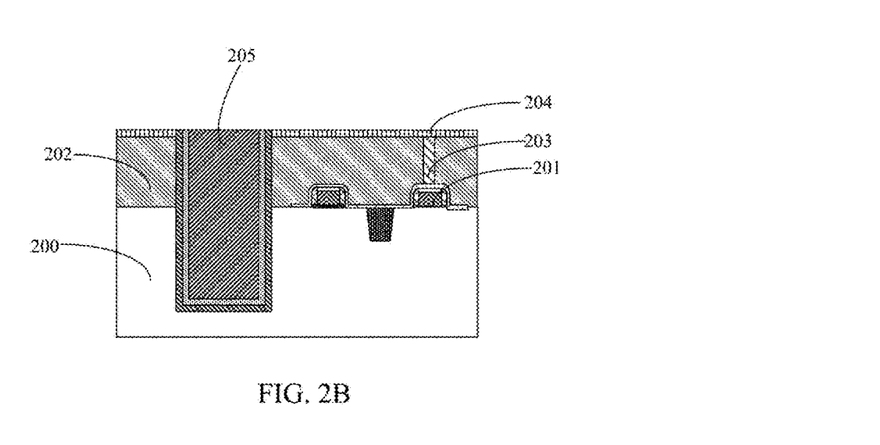

First, as illustrated in FIG. 2A, a semiconductor substrate 200 is provided, and a device 201 and an interlayer dielectric layer 202 covering device 201 are formed on semiconductor substrate 200. A hard mask layer 204 is formed on interlayer dielectric layer 202, and a contact connector 203 electrically coupled to device 201 is formed in interlayer dielectric layer 202.

A through hole penetrating through hard mask layer 204, interlayer dielectric layer 202 and a portion of semiconductor substrate 200 is formed. An isolation layer and a barrier layer are sequentially formed on a bottom and side walls of the through hole and hard mask layer 204. Chemical plating is performed to fill the through hole with copper metal until the through hole is fully filled, and continue to form copper metal on hard mask layer 204, ultimately forming a metal copper layer 205 that fills the through hole and covers hard mask layer 204. After the copper plating, the wafer bends forward with a BOW value of about 163.77 μm, which measures the bending of the wafer.

Next, an annealing treatment is performed to make the copper layer more dense. After the annealing treatment, the wafer bending becomes negative with a BOW value of about −89.68 μm.

Subsequently, a chemical mechanical polishing is performed on the copper layer, and the polishing stops in hard mask layer 204. The chemical mechanical polishing removes the copper layer, the barrier layer and the isolation layer on hard mask layer 204. After this processing step, the wafer becomes forward bending again with a BOW value of about 23.88 μm.

Figure 3:
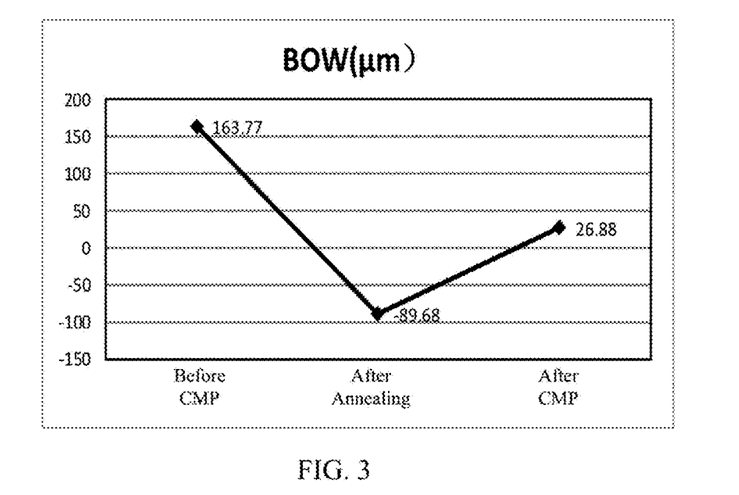
FIG. 3 illustrates a trend of wafer stress change before and after a chemical mechanical polishing process in a current TSV process.

As can be seen from a trend of wafer stress change illustrated in FIG. 3, the current process will introduce dramatic changes in the stress of the wafer, which may result in the generation of TSV cracks and cause copper diffusion problems, thus, increasing a leakage between the TSV and the substrate.

Accordingly, the present invention provides a new manufacturing method to solve the problems described above.

EXAMPLES

Described below in detail in conjunction with FIGS. 4 and 5A-5C are methods of manufacturing semiconductor devices according to embodiments of the present invention.

Figure 4:
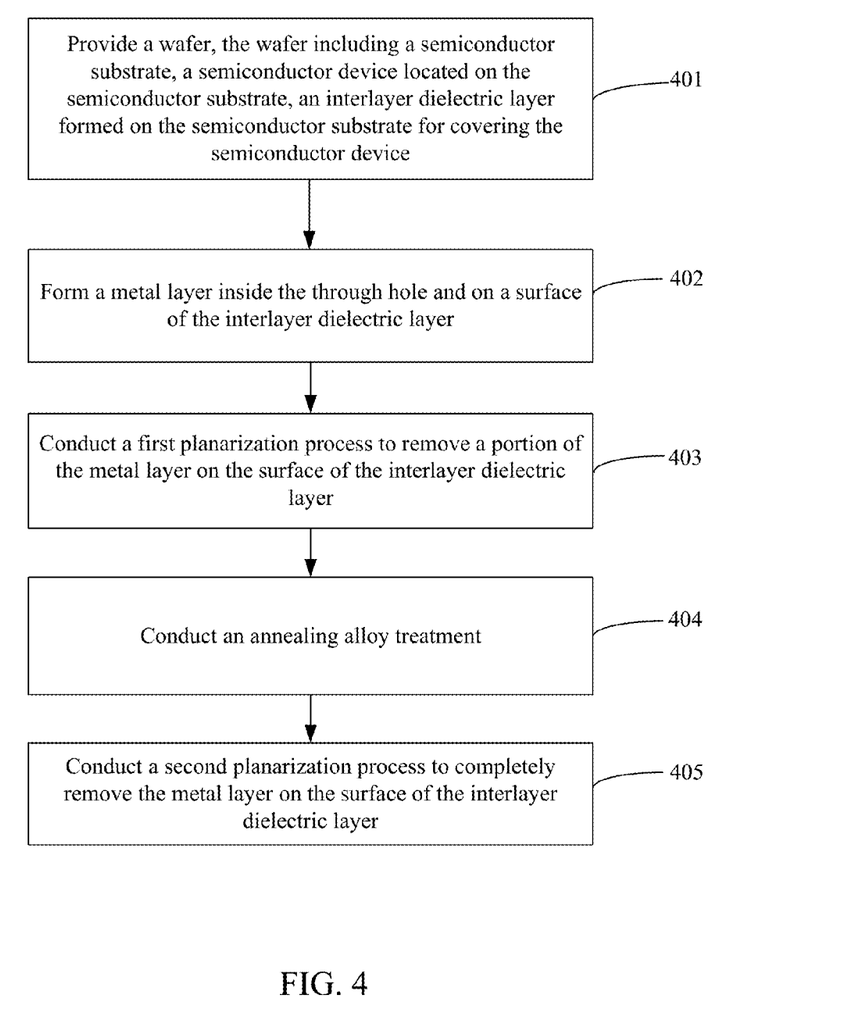
FIG. 4 illustrates a flow chart of a process of manufacturing TSV according to an embodiment of the present invention.
Figure 5A:
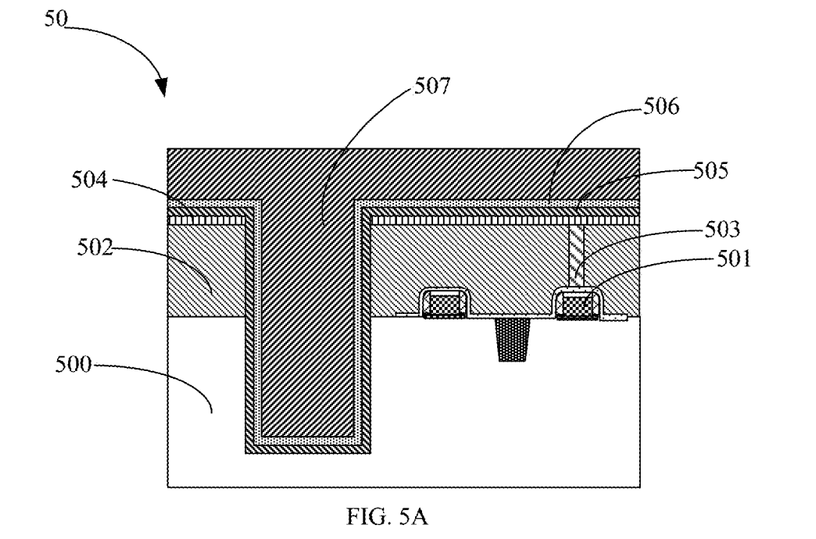
FIGS. 5A-5C illustrate cross-sectional views of a device manufactured by corresponding processes of a TSV process according to an embodiment of the present invention.
Figure 5B:
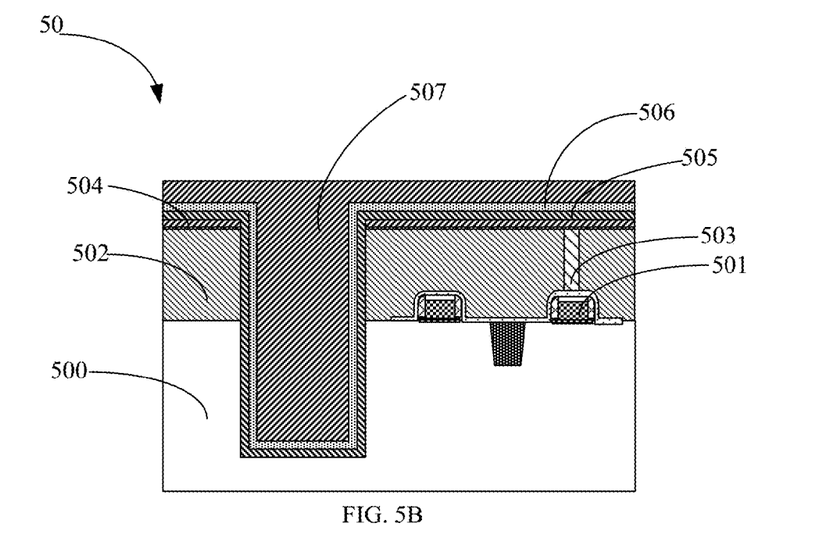
Figure 5C:
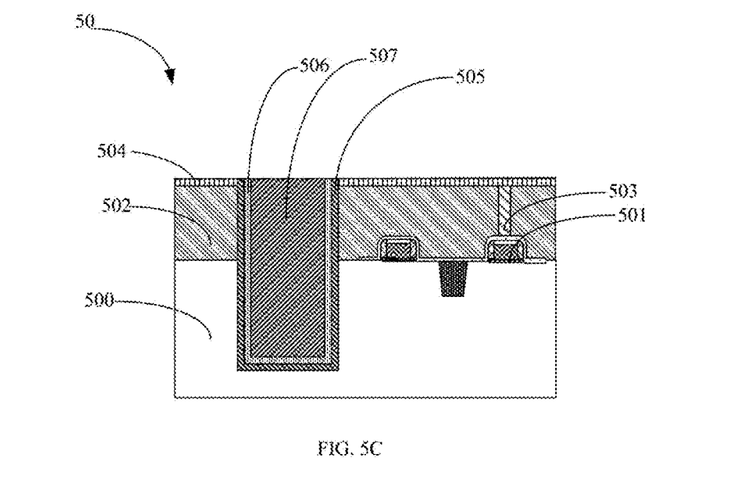

FIG. 4 illustrates a flow chart of a process for manufacturing TSV, according to an embodiment of the present invention; and FIGS. 5A-5C illustrate cross-sectional views of a device manufactured by corresponding processes of a TSV manufacturing process according to an embodiment of the present invention.

At block 401, a wafer 50 is provided, wafer 50 including a semiconductor substrate 500, a device 501 located on semiconductor substrate 500, and an interlayer dielectric layer 502 formed on semiconductor substrate 500 and covering device 501. Wafer 50 further includes a through hole penetrating through interlayer dielectric layer 502 and a portion of semiconductor substrate 500.

As shown in FIG. 5A, semiconductor substrate 500 may be at least one of the following materials: silicon, silicon on insulator (SOI), stacked silicon-on-insulator (SSOI), stacked silicon germanium-on-insulator (S—SiGeOI), silicon germanium-on-insulator (SiGeOI), germanium-on-insulator (GeOI) or the like. Active regions may be defined on semiconductor substrate 500. An isolation structure may be formed in semiconductor substrate 500, wherein the isolation structure may be a shallow trench isolation (STI) structure or a local oxidation of silicon (LOCOS) isolation structure.

Device 501 may include a plurality of individual circuit elements, such as transistors, diodes, resistors, capacitors, inductors or the like. Device 501 may also be other active or passive semiconductor devices made using various integrated circuit manufacturing process. A transistor is used as an example of device 501 in FIG. 5A for illustration purpose only, and does not herein limit the scope of the present invention to the specific example.

Interlayer dielectric layer 502 is formed on semiconductor substrate 500, covering device 501 such that device 501 is isolated from subsequently formed interconnect structure. Interlayer dielectric layer 502 may be a single layer or a multi-layer structure, which, in particular, may be a silicon oxide layer, including a doped or undoped silicon oxide material layer formed using a thermal chemical vapor deposition (thermal CVD) process or a high density plasma (HDP) process, such as undoped silicon glass (USG), phosphosilicate glass (PSG) or borophosphosilicate glass (BPSG). In addition, interlayer dielectric layer 502 may be a boron or phosphorus doped spin-on-glass (SOG), phosphorus doped tetraethoxysilane (PTEOS) or boron doped tetraethoxysilane (BTEOS).

A contact connector 503 electrically coupled to device 501 may also be formed in interlayer dielectric layer 502. The material of contact connector 503 used for coupling devices to the interconnect structure may include tungsten, copper or the like. Detailed methods for forming contact connector 503 are well known to those of skill in the art and will not be repeated herein.

Furthermore, a hard mask layer 504 may be sequentially formed on interlayer dielectric layer 502 to protect interlayer dielectric layer 502. For example, hard mask layer 504 may be a nitride layer, such as a silicon nitride layer.

A through hole penetrating through hard mask layer 504, interlayer dielectric layer 502, and a portion of semiconductor substrate 500 may also be formed on wafer 50.

In one embodiment, a method of forming the through hole includes the following steps: forming a patterned photoresist layer on the hard mask layer, using the patterned photoresist layer as a mask to sequentially etch the hard mask layer, the interlayer dielectric layer and a portion of the semiconductor substrate to form the through hole.

At block 402, a metal layer is formed inside the through hole and on a surface of the interlayer dielectric layer.

Still referring to FIG. 5A, a metal layer 507 is formed in the through hole and on a surface of interlayer dielectric layer 502. For example, the material of metal layer 507 may be selected from one or more of copper, aluminum, gold, tungsten or other metals. In some embodiments of the present invention, the material of metal layer 507 is copper. Metal layer 507 may be formed using physical vapor deposition, magnetically controlled sputtering, vapor deposition, chemical plating (e.g., electro-chemical plating, or ECP) or other methods. For example, in some embodiments, metal layer 507 may be formed using chemical plating.

In one embodiment, before forming copper metal layer 507, a copper seed layer (not shown) may be formed on the bottom and side walls of the through hole, and copper metal layer 507 may then be formed on the surface of the seed layer using chemical plating.

In one embodiment, before forming metal layer 507, an isolation layer 505 and a barrier layer 506 may be sequentially formed on the bottom and side walls of the through hole and the surface of interlayer dielectric layer 502.

Isolation layer 505 may electrically isolate substrate 500 from metal layer 507 subsequently filled in the through hole. In the embodiment shown in FIG. 5A, the material of isolation layer 505 may be silicon oxide, silicon nitride, oxide-nitride-oxide (ONO) multilayer structure, hafnium oxide or aluminum oxide.

In some embodiments, barrier layer 506 may be formed using physical vapor deposition (PVD), and metal layer 507 may be formed at a temperature between about −40° C. and about 400° C. and a pressure in a range of about 0.1 millitorr (mTorr) to about 100 mTorrs. The material of barrier layer 506 may be a metal or metal compound material, such as titanium-titanium nitride, tantalum-tantalum nitride, zirconium nitride, tungsten, tungsten nitride, titanium zirconium nitride, or an alloy or composition thereof. In addition, barrier layer 506 may also include a plurality of thin film layers.

After the formation of metal layer 507, wafer 50 exhibits a forward bending state, wherein the BOW value is about 157.65 μm.

At block 403, a first planarization process is performed to remove a portion of the metal layer on the surface of the interlayer dielectric layer.

Referring now to FIG. 5B, a conventional planarization method in semiconductor manufacturing field may be used to remove a portion of metal layer 507 on the surface of interlayer dielectric layer 502. Non-limiting examples of the planarization methods include mechanical planarization methods and chemical mechanical planarization methods. Typically, a chemical mechanical planarization method is used for the first planarization. In the embodiment illustrated in FIG. 5B, a thickness of the portion of metal layer 507 removed by the first planarization process is about 70% to about 90% of the thickness of metal layer 507 on the surface of interlayer dielectric layer 502, such as about 70%, about 75%, about 80%, about 85%, or about 90%.

In one embodiment, when about 80% of the thickness of metal layer 507 on the surface of interlayer dielectric layer 502 is removed, wafer 50 is forward bending with a BOW value of about 85.25 μm.

At block 404, an annealing alloy treatment is performed.

For example, the temperature of the annealing may range from about 100° C. to about 450° C., and the annealing time may be about 1 minute to about 60 minutes. The annealing alloy treatment may cause the metal grain to grow and make the metal layer more dense, while releasing stress in the metal layer.

After the annealing, the stress inside the metal layer may be released, but the wafer remains forward bending with a BOW value of about 10.42 μm.

At block 405, a second planarization step is performed to completely remove the metal layer on the surface of the interlayer dielectric layer.

Conventional planarization methods used in semiconductor manufacturing field may be used to remove portions of the metal layer on the surface of interlayer dielectric layer 502. Non-limiting examples of the planarization methods include mechanical planarization methods and chemical mechanical planarization methods. In one embodiment, a chemical mechanical planarization method is used for the second planarization.

In one embodiment as illustrated in FIG. 5C, the second planarization process is performed and stopped in hard mask layer 504 to fully remove metal layer 507, barrier layer 506 and isolation layer 505 on hard mask layer 504.

After this step, wafer 50 remains forward bending with a BOW value of about 24.95 μm.

Figure 6:
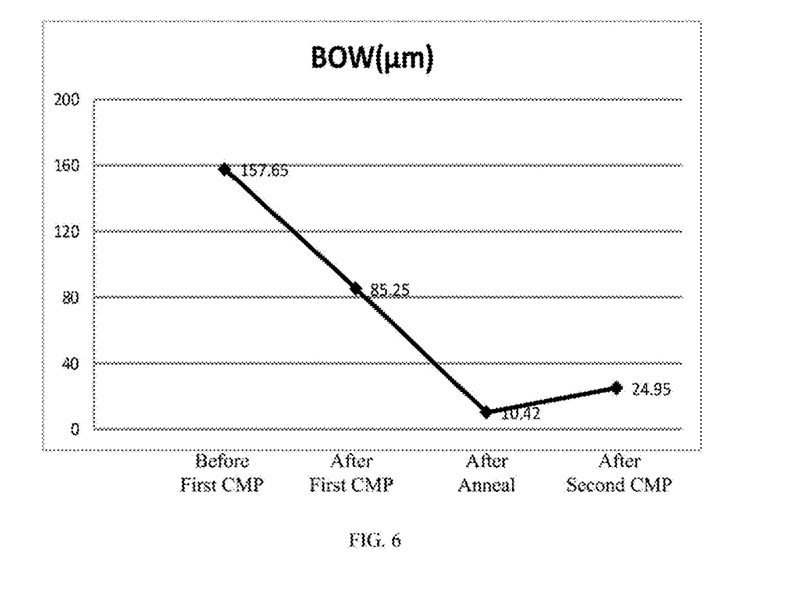
FIG. 6 illustrates a trend of wafer stress change before and after a chemical mechanical polishing process in a TSV process according to embodiments of the present invention.

FIG. 6 illustrates a trend of changes in wafer BOW value after major processes of embodiments of the present invention. By comparing FIG. 6 with FIG. 2, it can be seen that the ultimate stress of the wafer according to the manufacturing method of the present invention is substantially consistent with the ultimate stress using existing processes, yet the methods in the present invention enable a slow release of stress of the wafer and thus, can effectively prevent the generation of cracks in the silicon vias, thereby reducing TSV leakage problems. Testing and verification show that a failure rate caused by TSV leakage using existing processes can be as high as 60%, while a failure rate caused by TSV leakage is zero using manufacturing methods of the present invention.

In summary, using the manufacturing methods of the present invention, it is possible to slowly release the stress of the wafer and effectively prevent the generation of cracks in silicon vias, thereby reducing TSV leakage problems thus, improving the reliability and yield of the devices.

While the present invention is described herein with reference to illustrative embodiments, it should be understood that the above illustrative embodiments are for exemplification and illustration purpose only, and are not intended to limit the present invention to the embodiments described herein. Those of skill in the art would appreciate that the present invention is not limited to the above embodiments, and various different forms and modifications of the described embodiments may be made according to the teachings of the present invention, which all fall within the scope of protection of the present invention. The scope of protection of the present invention is determined by the attached claims and their equivalent thereof.

What is claimed is:

1. A lithographic method, comprising:
providing a wafer, the wafer including a semiconductor substrate, a semiconductor device located on the semiconductor substrate, an interlayer dielectric layer formed on the semiconductor substrate for covering the semiconductor device, and a through hole penetrating through the interlayer dielectric layer and a portion of the semiconductor substrate;
forming a metal layer inside the through hole and on a surface of the interlayer dielectric layer by chemical plating;
conducting a first planarization process to remove a portion of the metal layer on the surface of the interlayer dielectric layer and leave a remaining portion of the metal layer on an upper surface of the interlayer dielectric layer;
conducting, after the first planarization process, an annealing alloy treatment; and
conducting, after the annealing alloy treatment, a second planarization process to completely remove the remaining portion of the metal layer on the upper surface of the interlayer dielectric layer.

2. The method of claim 1, wherein a thickness of the removed portion of the metal layer is 70% to 90% of the thickness of the metal layer formed on the surface of the interlayer dielectric layer.

3. The method of claim 1, wherein a temperature of the annealing alloy treatment is between 100° C. and 450° C., and a time of the annealing alloy treatment is between 1 and 60 minutes.

4. The method of claim 1, wherein a material of the metal layer is copper.

5. The method of claim 1, further comprising:
before forming the metal layer, forming a hard mask layer on the interlayer dielectric layer, the through hole penetrating through the hard mask layer, the interlayer dielectric layer and the portion of the semiconductor substrate.

6. A lithographic method, comprising:
providing a wafer, the wafer including a semiconductor substrate, a semiconductor device located on the semiconductor substrate, an interlayer dielectric layer formed on the semiconductor substrate for covering the semiconductor device, and a through hole penetrating through the interlayer dielectric layer and a portion of the semiconductor substrate;
sequentially depositing an isolation layer and a barrier layer on a bottom and side walls of the through hole and the surface of the interlayer dielectric layer;
forming a metal layer inside the through hole and on a surface of the interlayer dielectric layer;
conducting a first planarization process to remove a portion of the metal layer on the surface of the interlayer dielectric layer and leave a remaining portion of the metal layer on an upper surface of the interlayer dielectric layer;
conducting, after the first planarization process, an annealing alloy treatment; and
conducting, after the annealing alloy treatment, a second planarization process to completely remove the remaining portion of the metal layer on the upper surface of the interlayer dielectric layer.

7. The method of claim 6, wherein the second planarization process further removes the isolation layer and the barrier layer on the surface of the interlayer dielectric layer.

8. The method of claim 1, wherein the first and the second planarization processes are chemical mechanical polishing processes.

9. The method of claim 6,
wherein a material of the isolation layer is at least one of silicon oxide, silicon nitride, oxide-nitride-oxide multilayer structure, hafnium oxide or aluminum oxide; and
wherein a material of the barrier layer is at least one of a titanium-titanium nitride multilayer structure, tantalum-tantalum nitride multilayer structure, zirconium nitride, tungsten, tungsten nitride, or titanium zirconium nitride.

* * * * *